United States Patent [19]

Nonogaki et al.

[11] 4,279,985

[45] Jul. 21, 1981

[54] PHOTOPOLYMER IMAGING USING EPOXY AND BROMINE CONTAINING ETHYLENICALLY UNSATURATED COMPOUNDS

[75] Inventors: Saburo Nonogaki, Tokyo; Yoshio Hatano, Hachioji, both of Japan

[73] Assignees: Nippon Telegraph and Telephone Public Corporation; Hitachi, Ltd., both of Japan

[21] Appl. No.: 33,842

[22] Filed: Apr. 27, 1979

Related U.S. Application Data

[63] Continuation-in-part of Ser. No. 768,728, Feb. 15, 1977, abandoned.

[30] Foreign Application Priority Data

Feb. 18, 1976 [JP] Japan .................................. 51-16029

[51] Int. Cl.$^2$ ................................................ G03C 1/68
[52] U.S. Cl. .................................... 430/280; 430/311; 430/907; 430/281; 430/272
[58] Field of Search ............... 430/270, 302, 281, 907, 430/942, 925, 280, 311

[56] References Cited

U.S. PATENT DOCUMENTS

| | | | |
|---|---|---|---|
| 3,885,060 | 5/1975 | Hirai et al. | 430/280 X |
| 3,895,954 | 7/1975 | Roteman | 430/925 X |
| 3,923,514 | 12/1975 | Marsh | 430/306 |
| 3,930,858 | 1/1976 | Limburg et al. | 430/907 |

FOREIGN PATENT DOCUMENTS 49-7495  1/1974  Japan .

OTHER PUBLICATIONS

Chem. Abstracts, vol. 77, 89371g; vol. 80, 84136m.

Primary Examiner—John D. Welsh
Attorney, Agent, or Firm—Craig & Antonelli

[57] ABSTRACT

A method for forming radiation images by using a polymeric compound having in the molecule a plurality of epoxy groups and a plurality of bromine atoms. The polymeric compound has a high radiation sensitivity and high contrast.

10 Claims, 6 Drawing Figures

PHOTOPOLYMER IMAGING USING EPOXY AND BROMINE CONTAINING ETHYLENICALLY UNSATURATED COMPOUNDS

This application is a continuation-in-part of U.S. Ser. No. 768,728, filed Feb. 15, 1977, now abandoned.

BACKGROUND OF THE INVENTION

The present invention relates to a method for forming radiation images.

As is well-known in the art, an organic compound having a photosensitivity is an indispensable material in the field of production of semi-conductor devices. This material is ordinarily used as a protective layer when a silicon oxide layer as a mask for impurity diffusion is etched. More specifically, in the process for production of semi-conductor devices, diffusion of impurities is often accomplished by forming holes of a specific pattern or masking windows on a silicon oxide layer formed on a semiconductor substrate and diffusing impurities into the substrate through these holes. Accordingly, the precision of diffusion of impurities into the semiconductor substrate depends greatly on the precision of formation of masking windows, namely the masking precision and mask aligning precision of a photosensitive material.

As materials that can be used as the protective layer, there have heretofore been used KPR and KTFR (trademarks for photosensitive materials manufactured by Eastman Kodak Co.) and AZ 1350 (trademark for a photosensitive material manufactured by Shipley Co.). Such photosensitive materials are coated on a silicon oxide layer and exposed to ultraviolet rays imagewise through a suitable mask, development is carried out by using a liquid developer and the silicon oxide layer is chemically etched by using the resulting imagewise photosensitive material layer as a protective layer.

This method is a modification of the photolithographical method heretofore practically utilized for photographic production of printing plates. However, according to this method including exposure to ultraviolet rays, it is difficult to reduce the etching size and precision below the critical wave length of rays used for the exposure (about 0.4 μm). Recently, however, large scale integrated circuits (LSI circuits) comprising great numbers of elements and connections built in one small semi-conductor substrate are eagerly desired and vigorously developed, and in order to improve the packing density in such circuits, development of a lithographic technique capable of very fine and precise etching is now desired in the art. As means for meeting such desire, there have been studied photolithographic methods using electron beams or X-rays instead of ultraviolet rays.

Since the wave length of electron beams is much shorter than the wave length of ultraviolet rays as is well-known in the art, they are suitable for very fine etching. Further, since control of intensity modulation or deflection is relatively easy in case of electron beams, there is attained an advantage that it is possible to control precisely the irradiation position and dose. By utilizing this advantage, it is made possible to further minimize semi-conductor elements and improve the frequency characteristics and packing density in the semiconductor elements. Also the wave length of X-rays is much shorter than the wave length of ultraviolet rays, and therefore, X-rays can be used for precise and fine etching as well as electron beams.

When electron beams or X-rays are used instead of ultraviolet rays in the photolithography, a radiation-sensitive material must be used as a protective layer-forming material corresponding to the photosensitive material.

One of important properties required of a radiation-sensitive material to be used as the masking material in the lithographic process using radiations is a high sensitivity to radiations. If a polymeric compound having a high sensitivity to radiations is used, the dose of radiations applied to the material can be greatly reduced and the time of exposure can be shortened to improve the operation efficiency.

Another important property required of a radiation-sensitive material to be used as the masking material in the lithographic process is a high contrast characteristic. By the term "high contrast characteristic" is meant such a property that the thickness of the layer of the developed material is readily changed depending on the change of the dose. If a radiation-sensitive polymeric compound having such high contrast characteristic is used, the boundary can be made remarkably definite between the material-remaining part and the material-free part on the surface of the substrate. Accordingly, a protective layer having a clear pattern of a high resolving power can easily be formed and the fineness of etching can be remarkably improved.

As the polymeric compound having a very high sensitivity to radiations, there are known compounds having in the molecule a number of epoxy linkages

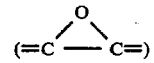

such as compounds disclosed in Japanese Patent Publication No. 7495/74. Such polymeric compound, for example, epoxidized 1,4-polybutadiene, is prepared by epoxidizing carbon-to-carbon double bonds (=C=C=) of 1,4-polybutadiene which is a synthetic rubber with an organic per acid such as peracetic acid. The so prepared epoxy structure-containing compound has a very high radiation sensitivity, but its contrast characteristic is not good.

List of Prior Art (37 CFR 1.56 (a))

The following references are cited to show the state of the art.
Japanese Patent Publication No. 7495/74.
Chem. Abstracts 77, 1972 89371 g
Chem. Abstracts 80, 1974 84136 m

SUMMARY OF THE INVENTION

It is a primary object of the present invention to provide an improved method for forming radiation images.

Another object of the present invention is to provide a method for application of a radiation-sensitive material having high sensitivity and high contrast.

These objects and other objects and advantages are attained by using a polymeric compound containing in the molecule a plurality of epoxy groups and a plurality of bromine atoms as the radiation-sensitive material.

DETAILED DESCRIPTION OF THE PREFERRED EMBODIMENTS

Figure 1:
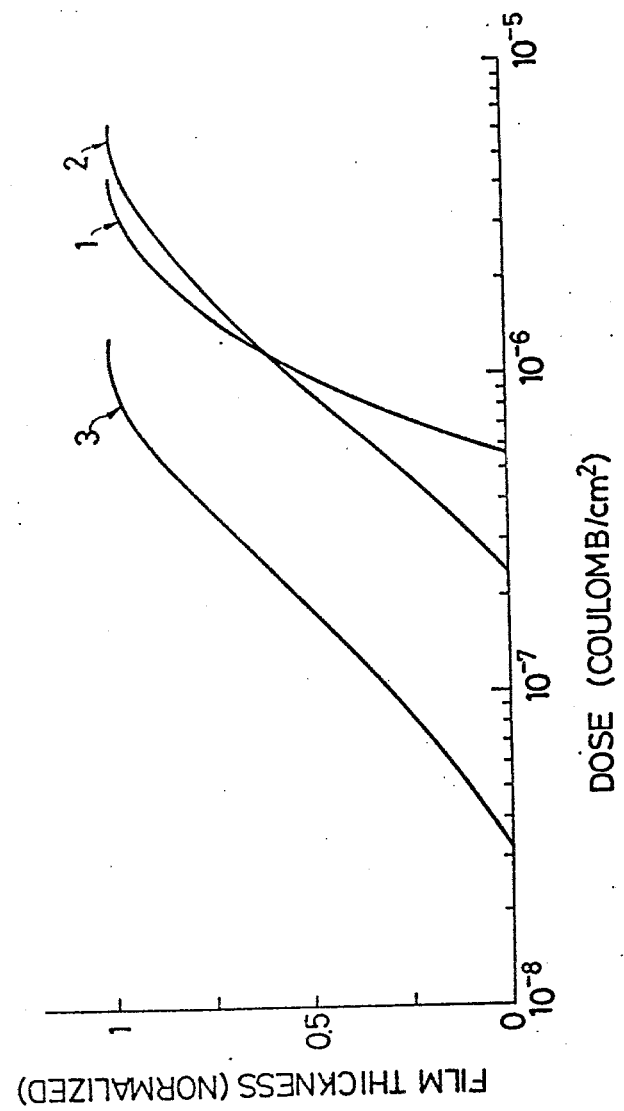
FIG. 1 is a diagram illustrating electron beam sensitivity characteristics of 1,2-polybutadiene, epoxidized 1,2-polybutadiene and brominated epoxidized 1,2-polybutadiene.

In the present invention, as the radiation-sensitive material there is used at least one polymeric compound selected from the group consisting of brominated and epoxidized polymers of butadiene, brominated and epoxidized copolymers of butadiene, brominated and epoxidized polymers of isoprene, brominated and epoxidized copolymers of isoprene, brominated products of copolymers of butadiene with addition-polymerizable compounds containing an epoxy group, brominated products of copolymers of isoprene with addition-polymerizable compounds containing an epoxy group and epoxidized products of copolymers of one of butadiene and isoprene with addition-polymerizable compounds containing a bromine atom.

The foregoing brominated and epoxidized compounds include partially brominated and partially epoxidized compounds.

A preferred degree of epoxidation is in the range from about 17 to about 70% and a preferred degree of bromination is in the range from about 7 to about 50%.

The degree of epoxidation or bromination means the ratio of the epoxidized or brominated monomer units in the polymer or copolymer to the total monomer units. The calculation of the degree of epoxidation or bromination is made based on the supposition that one monomer unit is epoxidized by one atom of oxygen or one monomer unit is brominated by two atoms of bromine. In general, when one monomer unit contains one carbon-to-carbon double bond, either of epoxidation and bromination takes place on one monomer unit. Accordingly, the value of the sum of the degree of epoxidation and the degree of bromination is always lower than 100%.

The foregoing polymeric compounds are prepared by subjecting a polymer or copolymer having a carbon-to-carbon double bond, such as polybutadiene, polyisoprene, a butadiene copolymer or an isoprene copolymer to addition of bromine and epoxidation in succession or simultaneously, subjecting a copolymer of a diene compound such as butadiene or isoprene with an epoxy group-containing, addition-polymerizable monomer to bromination, or by subjecting a copolymer of a diene compound with a bromine-containing, addition-polymerizable monomer to epoxidation.

In the present invention, two or more of these methods may be combined together for production of a radiation-sensitive polymeric compound. For example, if an increase in epoxy content is desired, it is possible to adopt a method comprising subjecting a copolymer of a diene compound with an epoxy group-containing compound to bromination and epoxidation.

As the polybutadiene, there may be employed any of 1,2-polybutadiene, 1,4-polybutadiene, polybutadienes having both the 1,2- and 1,4-structures and mixtures thereof. As the polyisoprene, there may be employed any of the isomers of polyisoprene.

As the butadiene copolymer, there can be used copolymers of butadiene with at least one monomer selected from the group consisting of aconitic acid, acrylonitrile, benzalacetophenone, butyl acrylate, 2-chlorobenzalacetophenone, 2-chloro-1,3-butadiene, p-chlorostyrene, 1-cyano-1,3-butadiene, 2,5-dichlorostyrene, diethyl fumarate, 1,1-dihydroperfluorobutyl acrylate, dimethyl butadiene, 2,3-dimethyl-1,3-butadiene, dimethyl dithiolfumarate, dinonyl fumarate, dinonyl maleate, ethyl-1-cyanocinnamate, hydrononyl acrylate, isobutylene, isoprene, methacrylic acid, methacrylonitrile, methyl acrylate, methyl-2-chlorocinnamate, methyl-4-chlorocinnamate, methyl methacrylate, α-methylstyrene, methyl thiolacrylate, 2-methyl-5-vinylpyridine, nonyl methacrylate, styrene, triethyl aconitate, trimethyl aconitate, vinyl chloride, vinyl formate, vinylidene chloride, vinylidene bromide, vinyl nonanoate, vinyl octadecanoate, vinyl pinonate and vinyl undecenoate.

As the isoprene copolymer, there can be used copolymers of isoprene with at least one monomer selected from the group consisting of acrylonitrile, 2-chloro-1,3-butadiene, dimethylbutadiene, 2,3-dimethylbutadiene, 2-fluorobutadiene, hexafluorobutadiene, isobutylene, piperylene, propylene, styrene, 2-vinylpyridine and 2-vinylquinoline.

As the epoxy group-containing, addition-polymerizable monomer, there can be mentioned, for example, glycidyl esters of unsaturated fatty acids, such as glycidyl acrylate and glycidyl methacrylate.

As the bromine-containing, addition-polymerizable monomer, there can be mentioned, for example, vinylidene bromide.

In these copolymers, it is preferred that the ratio of the diene compound monomer units to the total monomer units be in the range from 50 to 95%. These copolymers include copolymers of a diene compound with two or more of the above-exemplified comonomers.

In the present invention, it is preferred that the molecular weight of the radiation-sensitive polymeric compound be 1,000 to 10,000,000, especially 100,000 to 2,000,000.

Known epoxidation and bromination methods can be used for the synthesis of the polymeric compound used in the present invention. For example, a compound having an epoxy structure can be prepared by using as an epoxidizing reagent an organic peracid such as peractic acid, perbenzoic acid, perphthalic acid or p-chloroperbenzoic acid and reacting it with a compound having a carbon-to-carbon double bond to epoxidize the carbon-to-carbon double bond. A bromine-containing compound can be prepared by reacting bromine in the elementary state with a compound having a carbon-to-carbon double bond to add the bromine atom to the carbon-to-carbon double bond.

Bromine in the elementary state may be introduced in the reaction system in the form of a solution in an organic solvent, for example, in a solution of bromine in carbon tetrachloride.

Since bromine in the elementary state is highly reactive and easily volatile, use of bromine in the elementary state is not preferred when bromination is carried out while controlling the degree of bromination. In this case, there is preferably adopted a method in which bromine is generated in the reaction system by reacting a bromine compound such as potassium bromide with an organic peracid such as peracetic acid and the so generated bromine atom is added to the carbon-to-carbon double bond. According to this method, if the peracid is present in excess, substantially all of bromine contained in potassium bromide is liberated as bromine in the elementary state. When the reaction is continued until the color of bromine in the solution disappears, substantially all of bromine introduced into the reaction system is bonded to the polymeric compound. Therefore, this method is very valuable when bromination is carried out quantitatively. According to this bromine-generating method, since peracetic acid which also acts as an epoxidizing reagent is used, if both bromination and epoxidation are conducted in succession or simultaneously as in the present invention, the number of reactants used can be reduced and the reaction operations can be effectively simplified.

The reasons why an epoxidized polymeric compound has a high sensitivity to electron beams are believed to be as follows:

The epoxy group has a large strain energy in the structure thereof, and its ring is effectively opened under electron beams. The opened epoxy group reacts with the other epoxy group according to a mechanism similar to the hardening mechanism in practical epoxy resins to form a crosslink between polymeric molecules. Since this reaction proceeds successively, a number of crosslinks are formed by ring opening of one epoxy group. Accordingly, crosslinking of polymeric molecules is accomplished very effectively by irradiation of electron beams and therefore, the polymeric molecules can be sufficiently insolubilized by irradiation of a relatively low dose of electron beams. Therefore, a polymeric compound having in the molecule a number of epoxy groups has a high sensitivity to electron beams.

It is believed that a brominated polymeric compound has a high contrast characteristic to electron beams for the following reasons:

The carbon-to-bromine bond is a bond having a high polarity, and the intermolecular force of a polymeric compound containing such bonds is large. In the case where a polymeric compound is insolubilized under electron beams, when the density of crosslinks formed by exposure to electron beams arrives at a certain level, a three-dimensional network structure is formed and hence, the polymer is insolubilized. If the intermolecular force is strong, the proportion of polymeric molecules which are not completely insolubilized but are confined in the network structure by this strong intermolecular force increases. As the proportion of polymeric molecules confined in the network structure increases, the ratio of the increase of the thickness of the insolubilized polymer film to the increase of the dose of electron beams is heightened. In the electron beam sensitivity characteristics (the relation between the thickness of the insolubilized polymer film and the dose of electron beams), the contrast (the gradient of the characteristic curve) is heightened. Thus, the contrast in the electron beam sensitivity characteristics is heightened in the polymeric compound by bromination.

In Examples given hereinafter, electron beam sensitivity characteristics are mainly measured as radiation sensitivity characteristics of the radiation-sensitive polymer materials and excellent effects of the present invention are explained based on these measurement values. As a result of research works made in the art, it has been found that certain parallel relations are established among sensitivities of polymeric materials to different radiations. For example, a thesis appearing on page 289 of Applied Physical Letters, vol. 24 (1974) and written by P. V. Lenzo and E. G. Spencer discloses results of measurement of sensitivities of various polymeric materials to electron beams and soft X-rays, and it is concluded that a substantially proportional relation is established between the two sensitivities. Accordingly, it is construed that the radiation-sensitive polymeric materials of the present invention have high sensitivity and high contrast to not only electron beams but also other radiations such as soft X-rays, though only sensitivity characteristics to electron beams are mainly measured in Examples. Further, this fact can be proven by experiments.

The kind of a liquid developer used for the radiation-sensitive material of the present invention has influences on the resolution. As is well-known in the art, a solvent capable of dissolving therein a radiation-sensitive material but incapable of dissolving therein a radiation-crosslinked product of this material can be used as a developer. In general, preferred resolution can be obtained when dioxane, butyl actate or a mixed solvent containing dioxane or butyl acetate, for example, butyl acetate-ethyl cellosolve or dioxane-ethyl cellosolve, is used.

As will be apparent from Examples given hereinafter, when a polymeric compound containing in the molecule a number of carbon-to-carbon double bonds is epoxidized, the sensitivity to electron beams is enhanced, and when the epoxidized compound is brominated, the contrast of electron beam sensitivity characteristics is enhanced.

The present invention will now be described in detail by reference to the following illustrative Examples that by no means limit the scope of the invention. In all of these Examples, the molecular weight is measured according to the viscosity method.

EXAMPLE 1

To 50 ml of monochlorobenzene is added 1.5 g of 1,2-polybutadiene (RB 820 manufactured by Japan Synthetic Rubber Co.; having a 1,2-structure content of about 82%, a 1,4-structure content of about 18% and a molecular weight of about 160,000), and the mixture is heated to form a homogeneous solution. Separately, an acetic acid solution of peracetic acid to be used for epoxidation is prepared in the following manner:

Namely, 0.20 ml of concentrated sulfuric acid, 22 ml of glacial acetic and 4.1 ml of 30% aqueous hydrogen peroxide are mixed together, and the mixture is allowed to stand still overnight and 3.0 g of sodium acetate trihydrate is added to and dissolved in the mixture. The resulting precipitate of sodium sulfate is removed to obtain an acetic acid solution of peracetic acid, which contains about 1.1 moles per liter of peracetic acid.

To the above polybutadiene solution is added at room temperature the so prepared acetic acid solution of peracetic acid in an amount sufficient to epoxidize all the double bonds of the polybutadiene, and the mixture is agitated for 2 hours to effect epoxidation of the 1,2-polybutadiene.

By this epoxidation reaction conducted for 2 hours, all the 1,4-polybutadiene structures contained in the 1,2-polybutadiene are substantially epoxidized, while the 1,2-polybutadiene structures are hardly epoxidized. This fact can be proven by analysis of the nuclear magnetic resonance spectrum (NMR spectrum) of the reaction product. Accordingly, the so epoxidized 1,2-polybutadiene still contains large quantities of double bonds, and the reaction mixture still contains a large quantity of unreacted peracetic acid.

Then, while the reaction mixture is agitated continuously, a solution of 2.3 g of potassium bromide (containing bromine in an amount sufficient to add to 35% of the original double bonds in the starting 1,2-polybutadiene) in 7 ml of water is added to the reaction mixture. By reaction of potassium bromide with peracetic acid left in the reaction mixture, bromine is generated and the color of the reaction mixture becomes brown. However, as addition of bromine to the double bonds of the 1,2-polybutadiene proceeds, bromine is gradually consumed and the reaction mixture becomes colorless.

The reaction mixture is washed twice with about 200 ml of water and 20 g of sodium bicarbonate is added to the reaction mixture to neutralize remaining acetic acid and a minute amount of peracetic acid. Then, 25 ml of cyclohexane is added to the reaction mixture and the resulting mixture is subjected to centrifugal separation to recover a transparent supernatant. Then, 50 ml of cyclohexane is added to the supernatant to precipitate the resulting polymeric compound, and the precipitate is collected. This product is brominated epoxidized 1,2-polybutadiene. The fact that 1,2-polybutadiene has been epoxidized and brominated according to the above-mentioned method can be confirmed from the infrared absorption spectrum of the product. More specifically, an absorption peak inherent of the epoxy group appears at a wave number of 830 cm$^{-1}$ and an absorption peak inherent of the carbon-to-bromine bond appears at a wave number of 600 cm$^{-1}$.

In the so formed polymeric compound, the degree of epoxidation is about 18% and the degree of bromination is about 35%.

The radiation sensitivity characteristics of the brominated epoxidized 1,2-polybutadiene obtained according to the above-mentioned method are measured according to the following method.

The so obtained brominated epoxidized 1,2-polybutadiene is dissolved in 20 ml of monochlorobenzene to form a homogeneous solution, and the solution is spin-coated and dried on an oxidized silicon wafer to form a polymer film having a thickness of 0.3 to 0.6 μm. The coated wafer is placed in an electron beam exposure apparatus and is irradiated in vacuo with electron beams having an acceleration voltage of 15 KV, while the dose is varied. Then, the coated wafer is taken out of the apparatus and dipped in monochlorobenzene for 2 minutes to effect development. Then, monochlorobenzene is removed by hot air drying, and the thickness of the polymer film insolubilized by exposure to electron beams and left on the surface of the silicon wafer is measured by an interference microscope. The thickness of the film left after the development is plotted with respect to the electron beam dose to obtain a curve of electron beam sensitivity characteristics, namely curve 1 in FIG. 1. For comparison, the electron beam sensitivity characteristics of the starting 1,2-polybutadiene and the epoxidized 1,2-polybutadiene formed as the intermediate are measured according to the above-mentioned method, and curves 2 and 3 shown in FIG. 1 are obtained, respectively. The epoxidized 1,2-polybutadiene is one prepared by conducting epoxidation in the same manner as described above while using the same starting reagents, separating the epoxidation reaction product without conducting bromination and refining it.

As will be apparent from FIG. 1, the electron beam sensitivity characteristics (curve 2) of 1,2-polybutadiene are shifted to the low dose side, namely the high sensitivity side (toward curve 3), by epoxidation and it is confirmed that epoxidation is effective for improving the sensitivity to electron beams. Although the electron beam sensitivity characteristics (curve 3) of epoxidized 1,2-polybutadiene are shifted to the high dose side, namely the low sensitivity side (toward curve 1), by bromination, the contrast (the gradient of the curve) is simultaneously heightened, and it is confirmed that the high contrast characteristic is effectively enhanced by bromination.

EXAMPLE 2

According to a method similar to the method described in Example 1, brominated epoxidized 1,2-polybutadiene having a lower degree of bromination than that of the product of Example 1 is prepared.

More specifically, 1.5 g of 1,2-polybutadiene (RB 810 manufactured by Japan Synthetic Rubber Co.; having a 1,2-structure content of about 82%, a 1,4-structure content of about 18% and a molecular weight of about 160,000) is added to 45 ml of monochlorobenzene, and the mixture is heated to form a homogeneous solution. A peracetic acid solution prepared in the same manner as described in Example 1 is added to the solution, and epoxidation is carried out for 2 hours under agitation. Then, a solution of 1.10 g of potassium bromide (containing bromine in an amount sufficient to add to 17% of the double bonds of the starting 1,2-polybutadiene) in 10 ml of water is added to the reaction mixture and bromination reaction is conducted until the brown color of the reaction mixture disappears.

The reaction mixture is washed twice with 200 ml of water and 2 g of sodium bicarbonate is added to effect neutralization. Then, 5.5 ml of cyclohexane is added to the reaction mixture and a transparent polymer solution is recovered by centrifugal separation. Then, 70 ml of cyclohexane is added to the so recovered polymer solution and the precipitated polymeric compound is separated and collected from the solution to obtain brominated epoxidized 1,2-polybutadiene having a degree of epoxidation of about 18% and a degree of bromination of about 17%.

Figure 2:
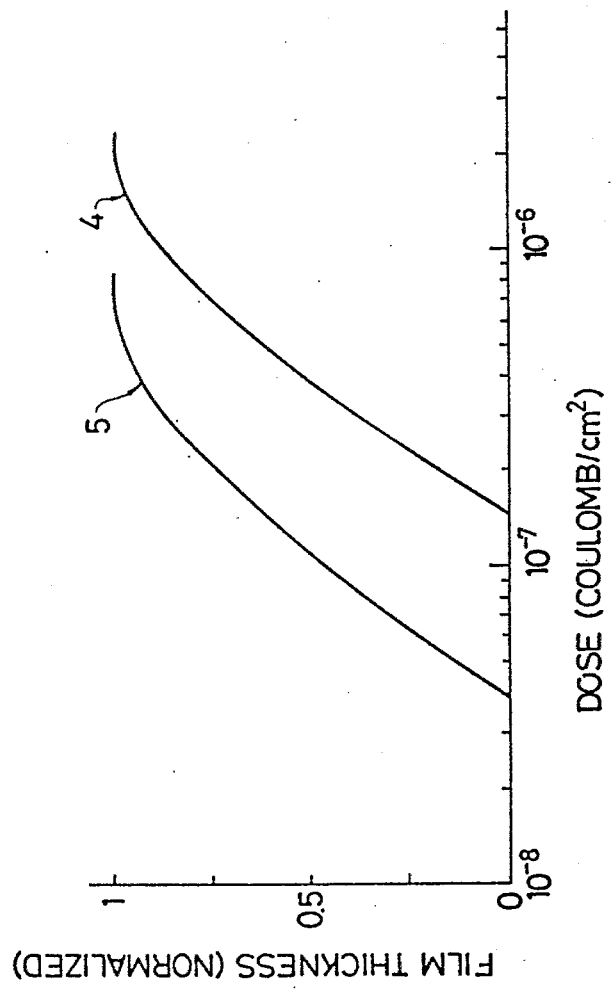
FIG. 2 is a diagram illustrating electron beam sensitivity characteristics of two brominated epoxidized 1,2-polybutadiene differing in the degree of bromination.

The so prepared brominated epoxidized 1,2-polybutadiene is dissolved in 30 ml of monochlorobenzene, and the electron beam sensitivity characteristics are determined in the same manner as described in Example 1 to obtain results shown in curve 4 in FIG. 2. It is seen that the so prepared brominated epoxidized 1,2-polybutadiene is a radiation-sensitivity polymeric material having high sensitivity and high contrast as well as the product obtained in Example 1.

EXAMPLE 3

According to a method similar to the method described in Example 1, brominated epoxidized 1,2- polybutadiene having a lower degree of bromination than that of the product of Example 2 is prepared.

More specifically, 1.5 g of 1,2-polybutadiene (RB 810 manufactured by Japan Synthetic Rubber Co.; having a 1,2-structure content of about 82%, a 1,4-structure content of about 18% and a molecular weight of about 160,000) is added to 30 ml of monochlorobenzene, and the mixture is heated to form a homogeneous solution. A peracetic acid solution prepared in the same manner as described in Example 1 is added to the solution, and epoxidation is carried out for 2 hours under agitation. Then, a solution of 0.60 g of potassium bromide (containing bromine in an amount sufficient to add to 9% of the double bonds of the starting 1,2-polybutadiene) in 5 ml of water is added to the reaction mixture and bromination reaction is conducted until the brown color of the reaction mixture disappears.

The reaction mixture is washed twice with 200 ml of water and 2 g of sodium bicarbonate is added to effect neutralization. Then, 140 ml of cyclohexane is added to the reaction mixture and a transparent polymer solution is recovered by centrifugal separation. Then, 300 ml of cyclohexane is added to the so recovered polymer solution and the precipitated polymeric compound is separated and collected from the solution to obtain brominated epoxidized 1,2-polybutadiene having a degree of epoxidation of about 18% and a degree of bromination of about 9%.

The so prepared brominated epoxidized 1,2-polybutadiene is dissolved in 30 ml of monochlorobenzene, and the electron beam sensitivity characteristics are determined in the same manner as described in Example 1 to obtain results shown in curve 5 in FIG. 2. It is seen that the so prepared brominated epoxidized 1,2-polybutadiene is a radiation-sensitive polymeric material having high sensitivity and high contrast as well as the product obtained in Example 1.

EXAMPLE 4

In 50 ml of monochlorobenzene was dissolved 1.5 g of 1,4-polybutadiene (BR01 manufactured by Japan Synthetic Rubber Co.; having a molecular weight of about 330,000) to form a homogeneous solution. Then, a solution of 3.3 g of potassium bromide (containing bromine in an amount sufficient to add to 50% of the double bonds of the 1,4-polybutadiene) in 10 ml of water is added to the above solution and the mixture is agitated sufficiently. While agitation is being continued, 40 ml of an acetic acid solution of peracetic acid prepared in the same manner as described in Example 1 (containing peracetic acid in an amount 1.6 times the amount necessary to completely epoxidize the double bonds of the 1,4-polybutadiene) is added little by little to the above mixture. Every time the peracetic acid solution is added, a brown color of bromine appears and then disappears. After completion of the stepwise addition of the peracetic acid solution, agitation is continued for 2 hours to advance bromination and epoxidation. The color of bromine disappears in several minutes and it is confirmed that bromination is completed in the relatively early stage.

The resulting reaction mixture is washed twice with 200 ml of water and neutralized by 2 g of sodium bicarbonate, and 30 ml of cyclohexanone and 1.5 ml of monochlorobenzene are added to the reaction mixture, and a transparent polymer solution is obtained by centrifugal separation. Then, 10 ml of cyclohexane is added to the solution and the precipitate is recovered to obtain brominated epoxidized 1,4-polybutadiene having a degree of epoxidation of about 30% and a degree of bromination of about 50%.

The fact that 1,4-polybutadiene is brominated and epoxidized by the above method is confirmed from the infrared absorption spectrum of the product. An absorption peak inherent of the carbon-to-bromine bond appears at a wave number of 550 cm$^{-1}$ and an absorption peak inherent of the epoxy group appears at a wave number of 810 cm$^{-1}$.

Figure 3:
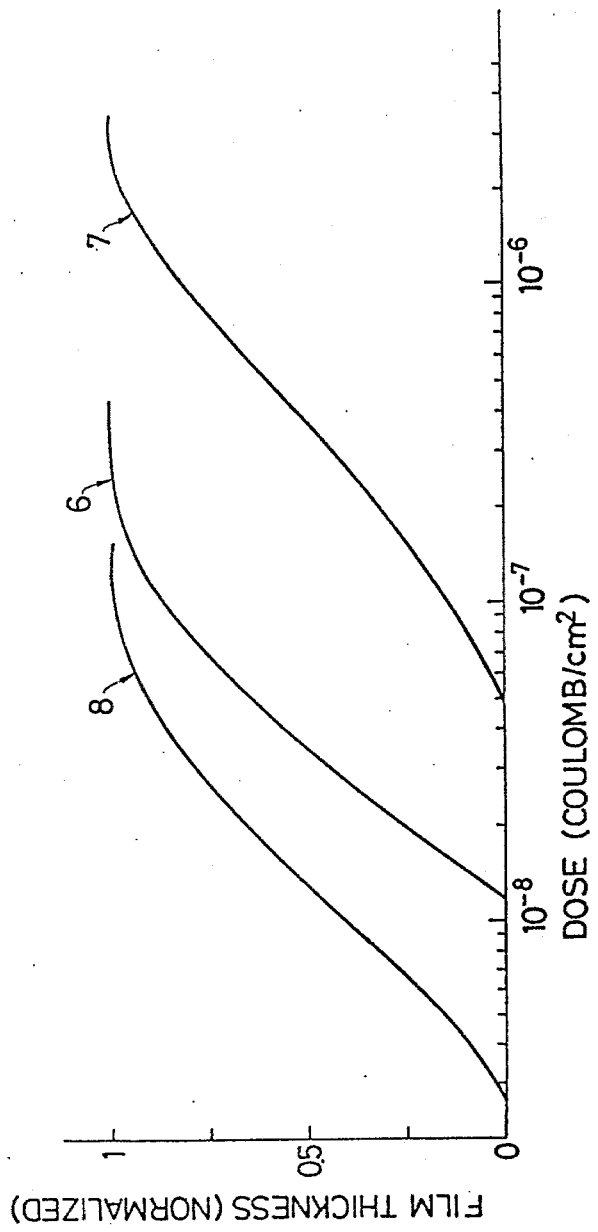
FIG. 3 is a diagram illustrating electron beam sensitivity characteristics of 1,4-polybutadiene, epoxidized 1,4-polybutadiene and brominated epoxidized 1,4-polybutadiene.

The so prepared brominated epoxidized 1,4-polybutadiene is dissolved in 15 ml of monochlorobenzene, and the electron beam sensitivity characteristics are determined according to the same method as described in Example 1 to obtain results shown in curve 6 in FIG. 3, from which it will readily be understood that the brominated epoxidized 1,4-polybutadiene is a radiation-sensitive material having very high sensitivity and very high contrast. For comparison, electron beam sensitivity characteristics of the starting 1,4-polybutadiene (curve 7) and the epoxidized 1,4-polybutadiene (curve 8) are also shown in FIG. 3. As described in Example 1, it is seen that the electron beam sensitivity of 1,4-polybutadiene is enhanced by epoxidation and the contrast is enhanced by bromination.

EXAMPLE 5

In 75 ml of monochlorobenzene is dissolved 2.76 g of 1,4-polybutadiene (BR01 manufactured by Japan Synthetic Rubber Co.) to form a homogeneous solution. While the solution is being agitated, a solution of 2.79 g in of bromine 25 ml of monochlorobenzene is added dropwise to the solution. The brown color of bromine instantaneously disappears by addition of bromine to 1,4-polybutadiene.

After completion of the dropwise addition of bromine, a solution of 0.5 g of sodium acetate trihydrate in 5 ml of water is added to the reaction mixture to neutralize a minute amount of hydrogen bromide formed by the reaction, and the mixture is agitated.

Then, 25 ml of an acetic acid solution of peracetic acid prepared in the same manner as described in Example 1 is added to the reaction mixture, and epoxidation is carried out for 1.5 hours under agitation. Then, the reaction mixture is washed twice with 100 ml of water and neutralized by 2.5 g of sodium bicarbonate. Then, 100 ml of toluene is added to the reaction mixture and the mixture is subjected to centrifugal separation to recover a transparent polymer solution. Then, 200 ml of cyclohexane is added to the solution, and the precipitated polymer is separated and collected to obtain brominated epoxidized 1,4-polybutadiene having a degree of epoxidation of about 30% and a degree of bromination of about 34%.

Figure 4:
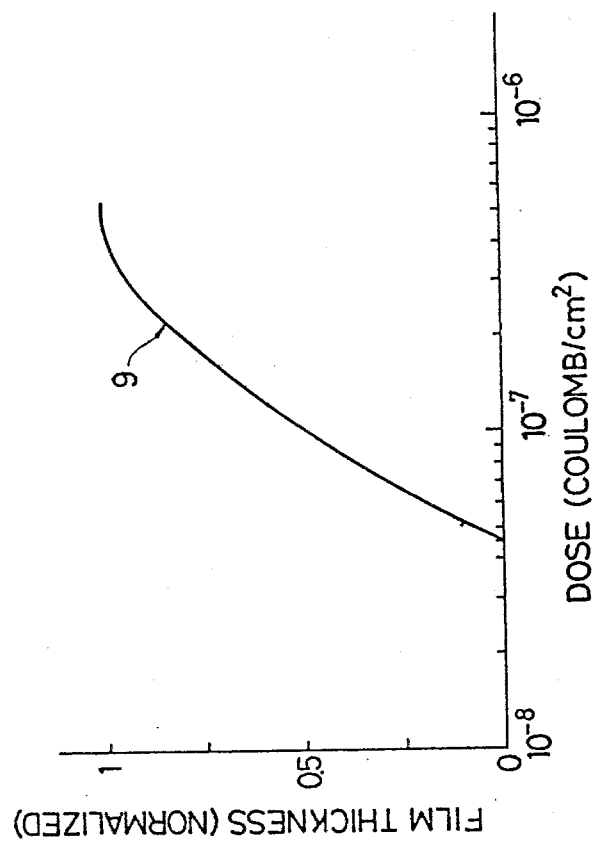
FIG. 4 is a diagram illustrating electron beam sensitivity characteristics of brominated epoxidized 1,4-polybutadiene.

The so prepared brominated epoxidized 1,4-polybutadiene is dissolved in 30 ml of monochlorobenzene, and electron beam sensitivity characteristics are measured in the same manner as described in Example 1 to obtain results shown in curve 9 in FIG. 4, from which also the product of this Example is a radiation-sensitive polymeric material having high sensitivity and high contrast.

EXAMPLE 6

In 50 ml of monochlorobenzene is dissolved 1.9 g of 1,4-polyisoprene (Cariflex IR 309 manufactured by Shell Chemical Corp.) to form a homogeneous solution. A solution of 3.3 g of potassium bromide (containing bromine in an amount sufficient to add to 50% of the double bonds of the 1,4-polyisoprene) in 10 ml of water is added to the above solution. The mixture is agitated sufficiently, and while agitation is being continued, 32 ml of an acetic solution of peracetic acid prepared in the same manner as described in Example 1 is added to the mixture. The color of bromine formed by the reaction between peracetic acid and potassium bromide disappears substantially instantaneously by addition of bromine to the double bonds of the 1,4-polyisoprene. After completion of the addition of peracetic acid, the reaction mixture is agitated for 2 hours to advance epoxidation.

The resulting reaction mixture is washed twice with 200 ml of water and neutralized by 2 g of sodium bicarbonate, and 100 ml of cyclohexane is added to the reaction mixture and the resulting mixture is subjected to centrifugal separation to obtain a transparent polymer solution. Then, 50 ml of cyclohexane is added to the polymer solution and the precipitated polymer is separated and isolated from the solution to obtain brominated epoxidized 1,4-polyisoprene having a degree of epoxidation of about 30% and a degree of bromination of about 50%.

The fact that 1,4-polyisoprene is brominated and epoxidized according to the above method is confirmed from the infrared absorption spectrum of the product, in which absorption peaks inherent of the carbon-to-bromine bond and the epoxy groups are observed at wave numbers of 550 $cm^{-1}$ and 875 $cm^{-1}$, respectively.

Figure 5:
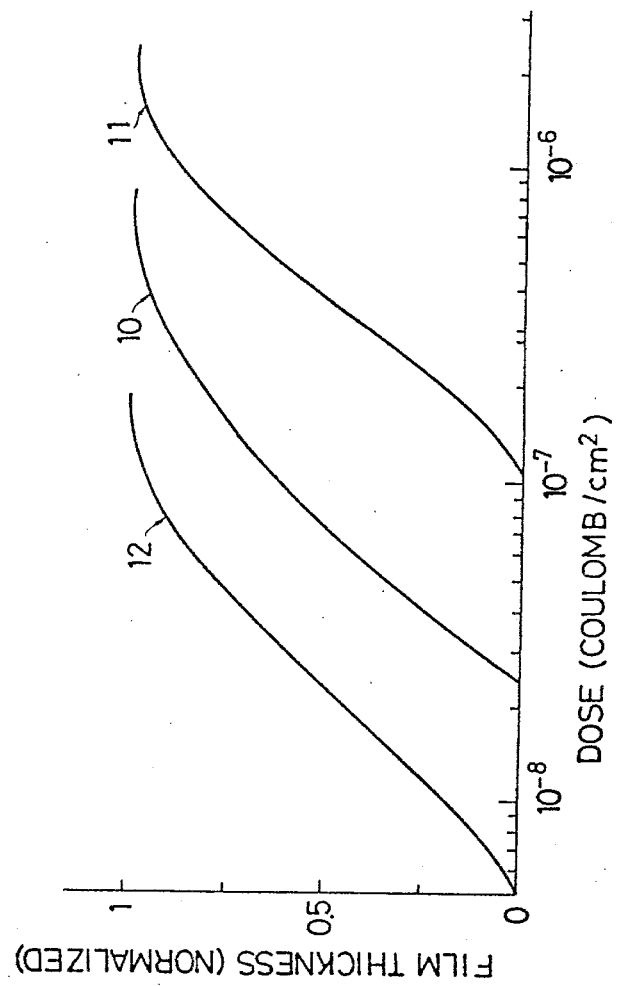
FIG. 5 is a diagram illustrating electron beam sensitivity characteristics of 1,4-polyisoprene, epoxidized 1,4-polyisoprene and brominated epoxidized 1,4-polyisoprene.

The so obtained brominated epoxidized 1,4-polyisoprene is dissolved in a mixed solvent of 20 ml of monochlorobenzene and 20 ml of toluene, and the electron beam sensitivity characteristics are determined in the same manner as described in Example 1 to obtain results shown in curve 10 in FIG. 5, from which it is seen that the so prepared brominated epoxidized 1,4-polyisoprene is a radiation-sensitive polymeric material having very high sensitivity and very high contrast. For comparison, electron beam sensitivity characteristics of the starting 1,4-polyisoprene (curve 11) and the epoxidized 1,4-polyisoprene (curve 12) are shown in FIG. 5. As described in Examples 1 and 4, the electron beam sensitivity of the 1,4-polyisoprene (curve 11) is enhanced (toward curve 12) by epoxidation and the contrast is enhanced (toward curve 10) by bromination.

EXAMPLE 7

In 40 ml of monochlorobenzene is dissolved 1.5 g of a styrene-butadiene copolymer (Ameripol 1513 manufactured by Goodrich Chemicals Co.; comprising 40 mole % of styrene and 60 mole % of butadiene) to form a homogeneous solution. A solution of 1.1 g of potassium bromide in 5 ml of water is added to the above solution, and the mixture is agitated sufficiently.

While the mixture is being agitated, 20 ml of an acetic acid solution of peracetic acid prepared in the same manner as described in Example 1 is added to the mixture. The color of bromine formed by the reaction between peracetic acid and potassium bromide disappears in several minutes by addition of bromine to the double bonds of the styrene-butadiene copolymer. The reaction mixture is agitated for 2 hours and 20 minutes to advance epoxidation.

The resulting reaction mixture is washed twice with 200 ml of water and neutralized by 2 g of sodium bicarbonate, and 30 ml of cyclohexane is added to the reaction mixture and the mixture is subjected to centrifugal separation to obtain a transparent polymer solution. Then, 60 ml of cyclohexane is added to the polymer solution, and the precipitated polymer is separated from the solution to obtain a brominated epoxidized styrene-butadiene copolymer having a degree of epoxidation of about 40% and a degree of bromination of about 28%.

The fact that the styrene-butadiene copolymer is brominated and epoxidized according to the abovementioned method is confired from the infrared absorption spectrum of the product, in which absorption peaks inherent of the carbon-to-bromine bond and the epoxy group are observed at wave numbers of 550 $cm^{-1}$ and 890 $cm^{-1}$, respectively. The latter peak actually appears as the shoulder of the vicinal peak.

The so prepared brominated epoxidized styrenebutadiene copolymer is dissolved in 30 ml of monochlorobenzene, and the electron beam sensitivity characteristics are determined in the same manner as described in Example 1 except that dioxane is used at the developer. Obtained results are shown in curve 13 in FIG. 6.

Figure 6:
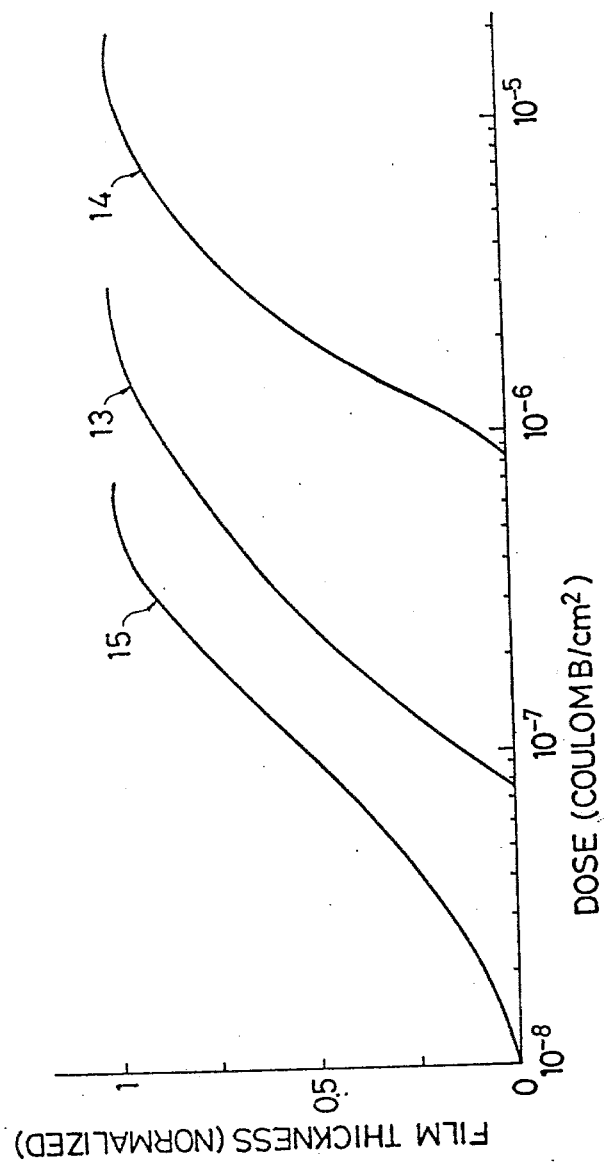
FIG. 6 is diagram illustrating electron beam sensitivity characteristics of a styrene-butadiene copolymer, an epoxidized styrene-butadiene copolymer and a brominated epoxidized styrene-butadiene copolymer.

For comparison, electron beam sensitivity characteristics of the starting styrene-butadiene copolymer (curve 14) and the epoxidized styrenebutadiene copolymer (curve 15) are also shown in FIG. 6. As described in Examples 1, 4 and 6, the sensitivity of the styrene-butadiene copolymer (curve 14) is enhanced (toward curve 15) by epoxidation and the contrast is enhanced (toward curve 13) by bromination.

What is claimed is:

1. A method for forming radiation images comprising the steps of (a) preparing a substrate, (b) forming on said substrate a radiation-sensitive film composed of at least one polymeric compound selected from the group consisting of brominated and epoxidized polymers of butadiene, brominated and epoxidized copolymers of butadiene, brominated and epoxidized polymers of isoprene, brominated and epoxidized copolymers of isoprene, brominated products of copolymers of butadiene with addition-polymerizable compounds containing an epoxy group, brominated products of copolymers of isoprene with addition-polymerizable compounds containing an epoxy group and epoxidized products of copolymers of one of butadiene and isoprene with addition-polymerizable compounds containing at least one bromine atom, wherein the degree of epoxidation of the polymeric compound is about 17 to about 70% and the degree of bromination of the polymeric compound is about 7 to about 50%, the value of the sum of the epoxidation degree and bromination degree being lower than 100%, (c) exposing at least a part of said film to radiations to thereby render said part of the film solvent-insoluble, and (d) removing solvent-soluble parts of said film by development.

2. A method for forming radiation images according to claim 1 wherein the development is carried out by using a solvent selected from the group consisting of dioxane, butyl acetate, a butyl acetate-ethyl cellosolve mixed solvent and a dioxane-ethyl cellosolve mixed solvent.

3. A method for forming radiation images according to claim 1 wherein the molecular weight of the polymeric compound is in the range from about 1,000 to about 10,000,000.

4. A method for forming radiation images according to claim 1 wherein the polymer of butadiene is selected from the group consisting of 1,2-polybutadiene, 1,4- polybutadiene and polybutadienes having both 1,2- and 1,4-structures.

5. A method for forming radiation images according to claim 1 wherein the polymer of isoprene is selected from the group consisting of 1,2-polyisoprene, 1,4-polyisoprene and polyisoprenes having both 1,2-and 1,4-structures.

6. A method for forming radiation images according to claim 1 wherein the copolymer of butadiene is a copolymer of butadiene with at least one monomer selected from the group consisting of aconitic acid, acrylonitrile, benzalacetophenone, butyl acrylate, 2-chlorobenzalacetophenone, 2-chloro-1,3-butadiene, p-chlorostyrene, 1-cyano-1,3-butadiene, 2,5-dichlorostyrene, diethyl fumarate, 1,1-dihydroperfluorobutyl acrylate, dimethyl butadiene, 2,3-dimethyl-1,3-butadiene, dimethyl dithiolfumarate, dinonyl fumarate, dinonyl maleate, ethyl-1-cyanocinnamate, hydrononyl acrylate, isobutylene, isoprene, methacrylic acid, methacrylonitrile, methyl acrylate, methyl-2-chlorocinnamate, methyl-4-chlorocinnamate, methyl methacrylate, α-methylstyrene, methyl thiolacrylate, 2-methyl-5-vinylpyridine, nonyl methacrylate, styrene, triethyl aconitate, trimethyl aconitate, vinyl chloride, vinyl formate, vinylidene chloride, vinylidene bromide, vinyl nonanoate, vinyl octadecanoate, vinyl pinonate and vinyl undecenoate, and the diene monomer units occupy about 50 to about 95% of the total monomer units in the copolymer.

7. A method for forming radiation images according to claim 1 wherein the copolymer of isoprene is a copolymer of isoprene with at least one monomer selected from the group consisting of acrylonitrile, 2-chloro-1,3-butadiene, dimethylbutadiene, 2,3-dimethylbutadiene, 2-fluorobutadiene, hexafluorobutadiene, isobutylene, piperylene, propylene, styrene, 2-vinylpyridine and 2-vinylquinoline, and the diene monomer units occupy about 50 to about 95% of the total monomer units in the copolymer.

8. A method for forming radiation images according to claim 1 wherein the epoxy group-containing addition-polymerizable compound is a glycidyl ester of an unsaturated fatty acid.

9. A method for forming radiation images according to claim 8 wherein the glycidyl ester of an unsaturated fatty acid is a member selected from the group consisting of glycigyl methacrylate and glycidyl acrylate.

10. A method for forming radiation images according to claim 1 wherein the bromine-containing, addition-polymerizable compound is vinylidene bromide.

* * * * *